United States Patent
Tsushita

(10) Patent No.: US 9,183,077 B2
(45) Date of Patent: Nov. 10, 2015

(54) DATA STORAGE APPARATUS AND METHOD FOR STORING DATA

(71) Applicant: FUJITSU LIMITED, Kawasaki-shi, Kanagawa (JP)

(72) Inventor: Katsuya Tsushita, Saitama (JP)

(73) Assignee: FUJITSU LIMITED, Kawasaki (JP)

( * ) Notice: Subject to any disclaimer, the term of this patent is extended or adjusted under 35 U.S.C. 154(b) by 79 days.

(21) Appl. No.: 14/143,532

(22) Filed: Dec. 30, 2013

(65) Prior Publication Data

US 2014/0289586 A1 Sep. 25, 2014

(30) Foreign Application Priority Data

Mar. 25, 2013 (JP) .................................. 2013-063085

(51) Int. Cl.
| | |
|---|---|
| G11C 29/00 | (2006.01) |
| G06F 11/08 | (2006.01) |
| G11C 5/00 | (2006.01) |
| G11C 7/10 | (2006.01) |

(52) U.S. Cl.
CPC ................ G06F 11/08 (2013.01); G11C 5/005 (2013.01); G11C 7/1006 (2013.01)

(58) Field of Classification Search
CPC ....... F16D 13/64; G06F 11/108; G06F 11/08; G11C 11/005; G11C 5/005
USPC .................................. 365/194, 189; 714/763
See application file for complete search history.

(56) References Cited

U.S. PATENT DOCUMENTS

| | | | | |
|---|---|---|---|---|
| 5,113,368 | A * | 5/1992 | Le Calvez et al. ............... | 710/53 |
| 5,345,272 | A * | 9/1994 | Ersoz et al. .................. | 348/561 |
| 5,406,518 | A * | 4/1995 | Sun et al. ...................... | 365/194 |
| 6,335,873 | B1 | 1/2002 | Kawaguchi et al. | |
| 8,171,329 | B2 * | 5/2012 | Ping et al. ..................... | 713/401 |
| 2005/0185476 | A1 | 8/2005 | Tachikawa | |
| 2006/0038597 | A1 * | 2/2006 | Becker et al. ................. | 327/158 |

FOREIGN PATENT DOCUMENTS

| | | |
|---|---|---|
| JP | 2000-268560 | 9/2000 |
| JP | 2005-234883 | 9/2005 |

OTHER PUBLICATIONS

C. Horikiri, "Urgent Need for Countermeasures against Soft Errors: SRAMs and Logical Circuits", Nikkei Electronics, Nikkei Business Publications, Inc., Japan, Jul. 4, 2005, Issue 903, pp. 63-70.
Y. Tosaka "The Facts of Soft Errors You Should Know: History, Evaluation Method, and Countermeasures", Nikkei Electronics, Nikkei Business Publications, Inc., Japan, Jul. 4, 2005, Issue 903, pp. 145-156.

* cited by examiner

*Primary Examiner* — David Ton
(74) *Attorney, Agent, or Firm* — Staas & Halsey LLP

(57) ABSTRACT

A data storage apparatus includes: a memory configured to store data; an input delay circuit configured to input a set of data of a plurality of bits into the memory at different timings between the plurality of bits by adding different delays to the plurality of bits in the set of data or by adding different delays to bits in bit groups obtained by grouping the plurality of bits in units of a consecutive bits; and an output delay circuit configured to obtain an original set of data, which is the set of data before the input delay circuit adds the different delays, by adding, to the plurality of bits in the set of data output from the memory, delays having a pattern opposite that of the delays added by the input delay circuit.

6 Claims, 16 Drawing Sheets

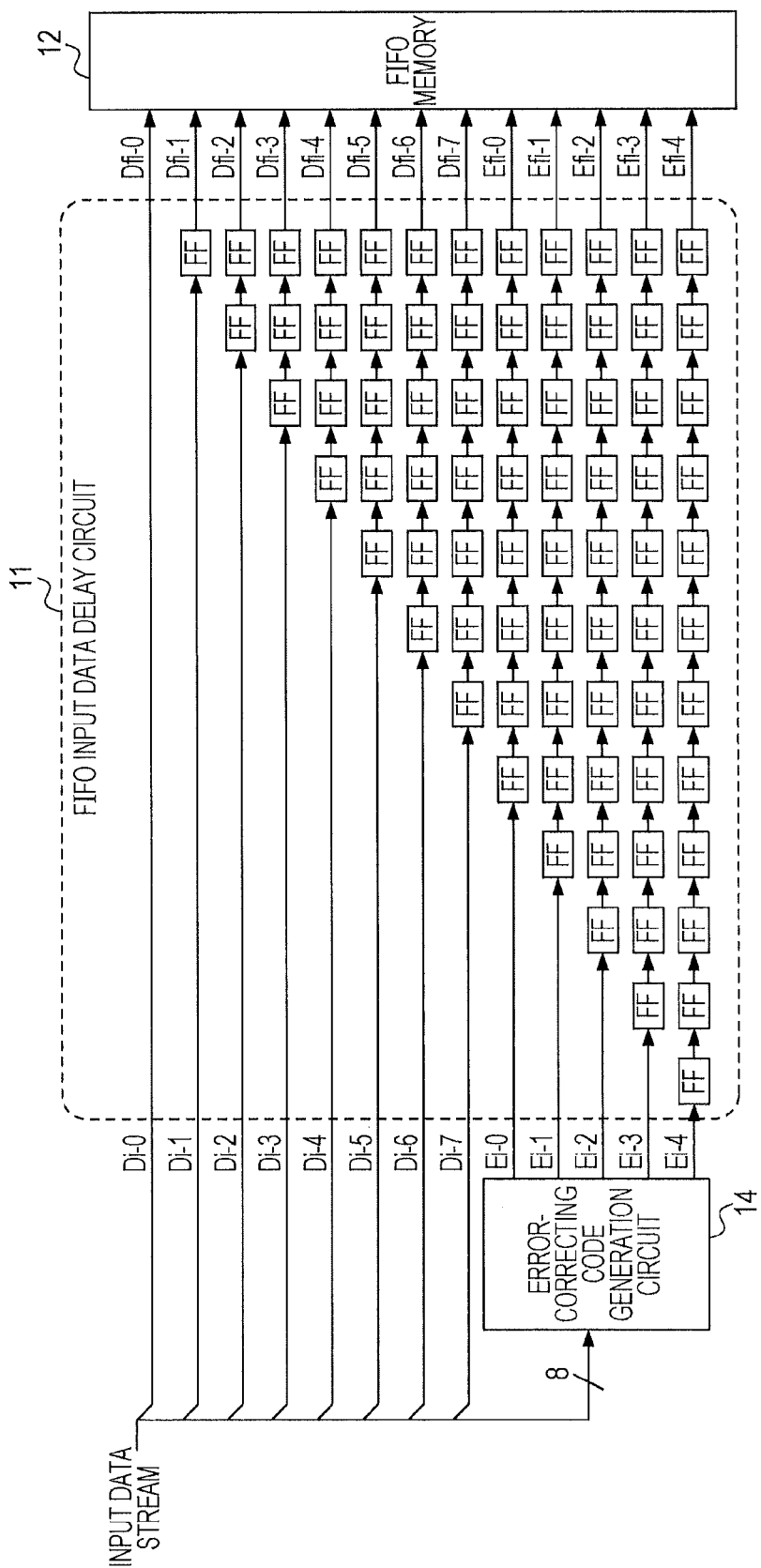

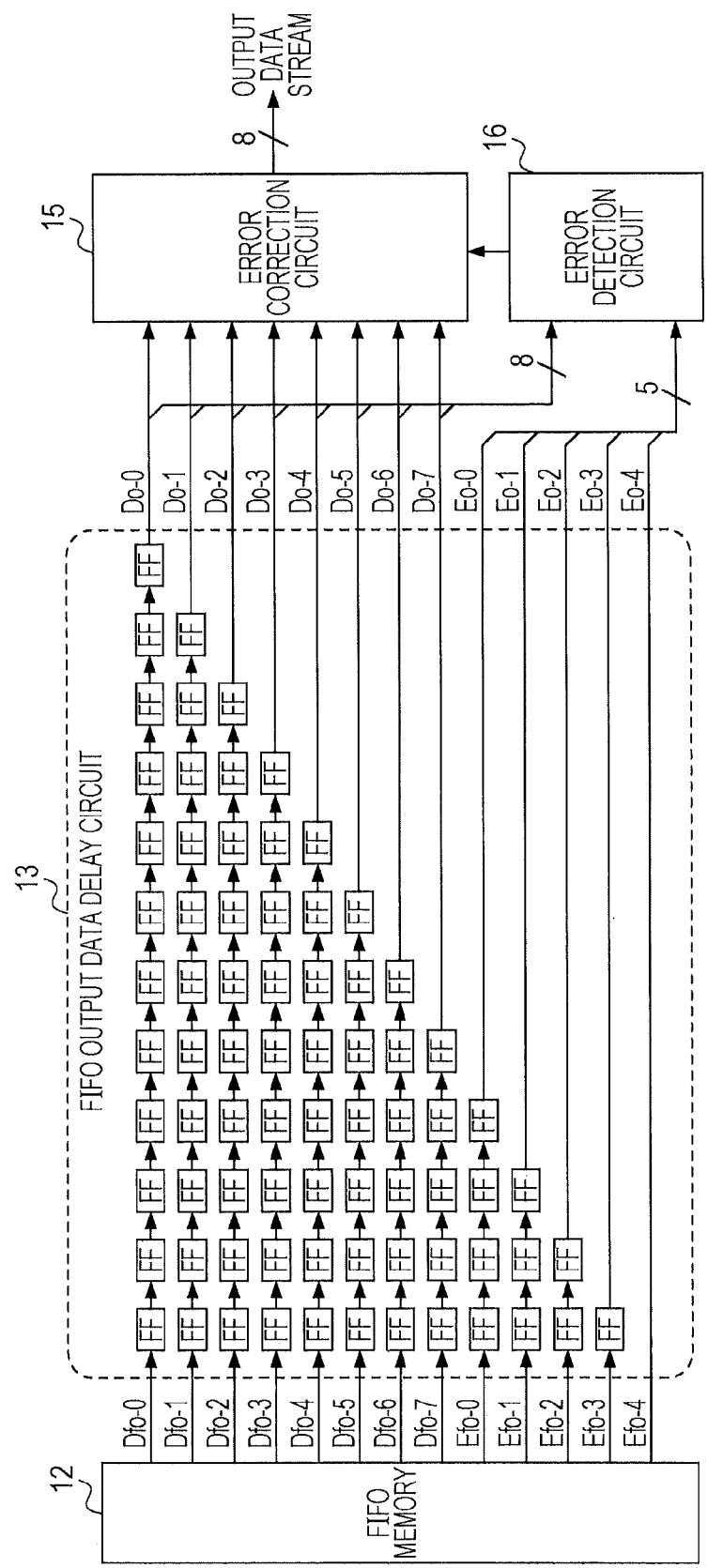

FIG. 6

| DATA STREAM HAVING 8-BIT WIDTH | | | | | | | | ERROR-CORRECTING CODES FOR Dn-0 TO Dn-7 | | | | |
|---|---|---|---|---|---|---|---|---|---|---|---|---|
| D1-0 | D1-1 | D1-2 | D1-3 | D1-4 | D1-5 | D1-6 | D1-7 | E1-0 | E1-1 | E1-2 | E1-3 | E1-4 |
| D2-0 | D2-1 | D2-2 | D2-3 | D2-4 | D2-5 | D2-6 | D2-7 | E2-0 | E2-1 | E2-2 | E2-3 | E2-4 |
| D3-0 | D3-1 | D3-2 | D3-3 | D3-4 | D3-5 | D3-6 | D3-7 | E3-0 | E3-1 | E3-2 | E3-3 | E3-4 |
| D4-0 | D4-1 | D4-2 | D4-3 | D4-4 | D4-5 | D4-6 | D4-7 | E4-0 | E4-1 | E4-2 | E4-3 | E4-4 |
| D5-0 | D5-1 | D5-2 | D5-3 | D5-4 | D5-5 | D5-6 | D5-7 | E5-0 | E5-1 | E5-2 | E5-3 | E5-4 |
| D6-0 | D6-1 | D6-2 | D6-3 | D6-4 | D6-5 | D6-6 | D6-7 | E6-0 | E6-1 | E6-2 | E6-3 | E6-4 |
| D7-0 | D7-1 | D7-2 | D7-3 | D7-4 | D7-5 | D7-6 | D7-7 | E7-0 | E7-1 | E7-2 | E7-3 | E7-4 |
| D8-0 | D8-1 | D8-2 | D8-3 | D8-4 | D8-5 | D8-6 | D8-7 | E8-0 | E8-1 | E8-2 | E8-3 | E8-4 |
| D9-0 | D9-1 | D9-2 | D9-3 | D9-4 | D9-5 | D9-6 | D9-7 | E9-0 | E9-1 | E9-2 | E9-3 | E9-4 |
| D10-0 | D10-1 | D10-2 | D10-3 | D10-4 | D10-5 | D10-6 | D10-7 | E10-0 | E10-1 | E10-2 | E10-3 | E10-4 |
| D11-0 | D11-1 | D11-2 | D11-3 | D11-4 | D11-5 | D11-6 | D11-7 | E11-0 | E11-1 | E11-2 | E11-3 | E11-4 |
| D12-0 | D12-1 | D12-2 | D12-3 | D12-4 | D12-5 | D12-6 | D12-7 | E12-0 | E12-1 | E12-2 | E12-3 | E12-4 |
| D13-0 | D13-1 | D13-2 | D13-3 | D13-4 | D13-5 | D13-6 | D13-7 | E13-0 | E13-1 | E13-2 | E13-3 | E13-4 |
| D14-0 | D14-1 | D14-2 | D14-3 | D14-4 | D14-5 | D14-6 | D14-7 | E14-0 | E14-1 | E14-2 | E14-3 | E14-4 |
| D15-0 | D15-1 | D15-2 | D15-3 | D15-4 | D15-5 | D15-6 | D15-7 | E15-0 | E15-1 | E15-2 | E15-3 | E15-4 |
| D16-0 | D16-1 | D16-2 | D16-3 | D16-4 | D16-5 | D16-6 | D16-7 | E16-0 | E16-1 | E16-2 | E16-3 | E16-4 |
| D17-0 | D17-1 | D17-2 | D17-3 | D17-4 | D17-5 | D17-6 | D17-7 | E17-0 | E17-1 | E17-2 | E17-3 | E17-4 |
| D18-0 | D18-1 | D18-2 | D18-3 | D18-4 | D18-5 | D18-6 | D18-7 | E18-0 | E18-1 | E18-2 | E18-3 | E18-4 |
| D19-0 | D19-1 | D19-2 | D19-3 | D19-4 | D19-5 | D19-6 | D19-7 | E19-0 | E19-1 | E19-2 | E19-3 | E19-4 |
| D20-0 | D20-1 | D20-2 | D20-3 | D20-4 | D20-5 | D20-6 | D20-7 | E20-0 | E20-1 | E20-2 | E20-3 | E20-4 |
| D21-0 | D21-1 | D21-2 | D21-3 | D21-4 | D21-5 | D21-6 | D21-7 | E21-0 | E21-1 | E21-2 | E21-3 | E21-4 |
| D22-0 | D22-1 | D22-2 | D22-3 | D22-4 | D22-5 | D22-6 | D22-7 | E22-0 | E22-1 | E22-2 | E22-3 | E22-4 |
| D23-0 | D23-1 | D23-2 | D23-3 | D23-4 | D23-5 | D23-6 | D23-7 | E23-0 | E23-1 | E23-2 | E23-3 | E23-4 |
| D24-0 | D24-1 | D24-2 | D24-3 | D24-4 | D24-5 | D24-6 | D24-7 | E24-0 | E24-1 | E24-2 | E24-3 | E24-4 |
| D25-0 | D25-1 | D25-2 | D25-3 | D25-4 | D25-5 | D25-6 | D25-7 | E25-0 | E25-1 | E25-2 | E25-3 | E25-4 |
| D26-0 | D26-1 | D26-2 | D26-3 | D26-4 | D26-5 | D26-6 | D26-7 | E26-0 | E26-1 | E26-2 | E26-3 | E26-4 |
| D27-0 | D27-1 | D27-2 | D27-3 | D27-4 | D27-5 | D27-6 | D27-7 | E27-0 | E27-1 | E27-2 | E27-3 | E27-4 |
| D28-0 | D28-1 | D28-2 | D28-3 | D28-4 | D28-5 | D28-6 | D28-7 | E28-0 | E28-1 | E28-2 | E28-3 | E28-4 |
| D29-0 | D29-1 | D29-2 | D29-3 | D29-4 | D29-5 | D29-6 | D29-7 | E29-0 | E29-1 | E29-2 | E29-3 | E29-4 |
| D30-0 | D30-1 | D30-2 | D30-3 | D30-4 | D30-5 | D30-6 | D30-7 | E30-0 | E30-1 | E30-2 | E30-3 | E30-4 |
| D31-0 | D31-1 | D31-2 | D31-3 | D31-4 | D31-5 | D31-6 | D31-7 | E31-0 | E31-1 | E31-2 | E31-3 | E31-4 |
| D32-0 | D32-1 | D32-2 | D32-3 | D32-4 | D32-5 | D32-6 | D32-7 | E32-0 | E32-1 | E32-2 | E32-3 | E32-4 |

TOP ↓

FIG. 8

| ADDRESS VIEWED FROM OUTSIDE | | | | | | | | | | | | | MEMORY STORAGE ADDRESS |
|---|---|---|---|---|---|---|---|---|---|---|---|---|---|
| 0000_0000 | D1-0 | | | | | | | | | | | | 0000_0000 |
| 0000_0001 | D2-0 | D1-1 | | | | | | | | | | | 0000_0001 |
| 0000_0010 | D3-0 | D2-1 | D1-2 | | | | | | | | | | 0000_0010 |
| 0000_0011 | D4-0 | D3-1 | D2-2 | D1-3 | | | | | | | | | 0000_0011 |
| 0000_0100 | D5-0 | D4-1 | D3-2 | D2-3 | D1-4 | | | | | | | | 0000_0100 |
| 0000_0101 | D6-0 | D5-1 | D4-2 | D3-3 | D2-4 | D1-5 | | | | | | | 0000_0101 |
| 0000_0110 | D7-0 | D6-1 | D5-2 | D4-3 | D3-4 | D2-5 | D1-6 | | | | | | 0000_0110 |
| 0000_0111 | D8-0 | D7-1 | D6-2 | D5-3 | D4-4 | D3-5 | D2-6 | D1-7 | | | | | 0000_0111 |
| 0000_1000 | D9-0 | D8-1 | D7-2 | D6-3 | D5-4 | D4-5 | D3-6 | D2-7 | E1-0 | | | | 0000_1000 |
| 0000_1001 | D10-0 | D9-1 | D8-2 | D7-3 | D6-4 | D5-5 | D4-6 | D3-7 | E2-0 | E1-1 | | | 0000_1001 |
| 0000_1010 | D11-0 | D10-1 | D9-2 | D8-3 | D7-4 | D6-5 | D5-6 | D4-7 | E3-0 | E2-1 | E1-2 | | 0000_1010 |
| 0000_1011 | D12-0 | D11-1 | D10-2 | D9-3 | D8-4 | D7-5 | D6-6 | D5-7 | E4-0 | E3-1 | E2-2 | E1-3 | 0000_1011 |
| 0000_1100 | D13-0 | D12-1 | D11-2 | D10-3 | D9-4 | D8-5 | D7-6 | D6-7 | E5-0 | E4-1 | E3-2 | E2-3 | E1-4 | 0000_1100 |
| 0000_1101 | D14-0 | D13-1 | D12-2 | D11-3 | D10-4 | D9-5 | D8-6 | D7-7 | E6-0 | E5-1 | E4-2 | E3-3 | E2-4 | 0000_1101 |
| 0000_1110 | D15-0 | D14-1 | D13-2 | D12-3 | D11-4 | D10-5 | D9-6 | D8-7 | E7-0 | E6-1 | E5-2 | E4-3 | E3-4 | 0000_1110 |
| 0000_1111 | D16-0 | D15-1 | D14-2 | D13-3 | D12-4 | D11-5 | D10-6 | D9-7 | E8-0 | E7-1 | E6-2 | E5-3 | E4-4 | 0000_1111 |
| 0001_0000 | D17-0 | D16-1 | D15-2 | D14-3 | D13-4 | D12-5 | D11-6 | D10-7 | E9-0 | E8-1 | E7-2 | E6-3 | E5-4 | 0001_0000 |
| 0001_0001 | D18-0 | D17-1 | D16-2 | D15-3 | D14-4 | D13-5 | D12-6 | D11-7 | E10-0 | E9-1 | E8-2 | E7-3 | E6-4 | 0001_0001 |
| 0001_0010 | D19-0 | D18-1 | D17-2 | D16-3 | D15-4 | D14-5 | D13-6 | D12-7 | E11-0 | E10-1 | E9-2 | E8-3 | E7-4 | 0001_0010 |
| 0001_0011 | D20-0 | D19-1 | D18-2 | D17-3 | D16-4 | D15-5 | D14-6 | D13-7 | E12-0 | E11-1 | E10-2 | E9-3 | E8-4 | 0001_0011 |
| 0001_0100 | D21-0 | D20-1 | D19-2 | D18-3 | D17-4 | D16-5 | D15-6 | D14-7 | E13-0 | E12-1 | E11-2 | E10-3 | E9-4 | 0001_0100 |
| 0001_0101 | D22-0 | D21-1 | D20-2 | D19-3 | D18-4 | D17-5 | D16-6 | D15-7 | E14-0 | E13-1 | E12-2 | E11-3 | E10-4 | 0001_0101 |
| 0001_0110 | D23-0 | D22-1 | D21-2 | D20-3 | D19-4 | D18-5 | D17-6 | D16-7 | E15-0 | E14-1 | E13-2 | E12-3 | E11-4 | 0001_0110 |
| 0001_0111 | D24-0 | D23-1 | D22-2 | D21-3 | D20-4 | D19-5 | D18-6 | D17-7 | E16-0 | E15-1 | E14-2 | E13-3 | E12-4 | 0001_0111 |
| 0001_1000 | D25-0 | D24-1 | D23-2 | D22-3 | D21-4 | D20-5 | D19-6 | D18-7 | E17-0 | E16-1 | E15-2 | E14-3 | E13-4 | 0001_1000 |
| 0001_1001 | D26-0 | D25-1 | D24-2 | D23-3 | D22-4 | D21-5 | D20-6 | D19-7 | E18-0 | E17-1 | E16-2 | E15-3 | E14-4 | 0001_1001 |
| 0001_1010 | D27-0 | D26-1 | D25-2 | D24-3 | D23-4 | D22-5 | D21-6 | D20-7 | E19-0 | E18-1 | E17-2 | E16-3 | E15-4 | 0001_1010 |
| 0001_1011 | D28-0 | D27-1 | D26-2 | D25-3 | D24-4 | D23-5 | D22-6 | D21-7 | E20-0 | E19-1 | E18-2 | E17-3 | E16-4 | 0001_1011 |
| 0001_1100 | D29-0 | D28-1 | D27-2 | D26-3 | D25-4 | D24-5 | D23-6 | D22-7 | E21-0 | E20-1 | E19-2 | E18-3 | E17-4 | 0001_1100 |
| 0001_1101 | D30-0 | D29-1 | D28-2 | D27-3 | D26-4 | D25-5 | D24-6 | D23-7 | E22-0 | E21-1 | E20-2 | E19-3 | E18-4 | 0001_1101 |
| 0001_1110 | D31-0 | D30-1 | D29-2 | D28-3 | D27-4 | D26-5 | D25-6 | D24-7 | E23-0 | E22-1 | E21-2 | E20-3 | E19-4 | 0001_1110 |
| 0001_1111 | D32-0 | D31-1 | D30-2 | D29-3 | D28-4 | D27-5 | D26-6 | D25-7 | E24-0 | E23-1 | E22-2 | E21-3 | E20-4 | 0001_1111 |

FIFO MEMORY READ ADDRESS

| ADDRESS VIEWED FROM OUTSIDE | | | | | | | | | | | | | MEMORY STORAGE ADDRESS |
|---|---|---|---|---|---|---|---|---|---|---|---|---|---|
| 0000_0000 | D1-0 | | | | | | | | | | | | 0000_0000 |
| 0000_0100 | D5-0 | D4-1 | D3-2 | D2-3 | D1-4 | | | | | | | | 0000_0001 |
| 0000_1000 | D9-0 | D8-1 | D7-2 | D6-3 | D5-4 | D4-5 | D3-6 | D2-7 | E1-0 | | | | 0000_0010 |
| 0000_1100 | D13-0 | D12-1 | D11-2 | D10-3 | D9-4 | D8-5 | D7-6 | D6-7 | E5-0 | E4-1 | E3-2 | E2-3 | E1-4 | 0000_0011 |
| 0001_0000 | D17-0 | D16-1 | D15-2 | D14-3 | D13-4 | D12-5 | D11-6 | D10-7 | E9-0 | E8-1 | E7-2 | E6-3 | E5-4 | 0000_0100 |
| 0001_0100 | D21-0 | D20-1 | D19-2 | D18-3 | D17-4 | D16-5 | D15-6 | D14-7 | E13-0 | E12-1 | E11-2 | E10-3 | E9-4 | 0000_0101 |
| 0001_1000 | D25-0 | D24-1 | D23-2 | D22-3 | D21-4 | D20-5 | D19-6 | D18-7 | E17-0 | E16-1 | E15-2 | E14-3 | E13-4 | 0000_0110 |
| 0001_1100 | D29-0 | D28-1 | D27-2 | D26-3 | D25-4 | D24-5 | D23-6 | D22-7 | E21-0 | E20-1 | E19-2 | E18-3 | E17-4 | 0000_0111 |
| 0000_0001 | D2-0 | D1-1 | | | | | | | | | | | 0000_1000 |
| 0000_0101 | D6-0 | D5-1 | D4-2 | D3-3 | D2-4 | D1-5 | | | | | | | 0000_1001 |
| 0000_1001 | D10-0 | D9-1 | D8-2 | D7-3 | D6-4 | D5-5 | D4-6 | D3-7 | E2-0 | E1-1 | | | | 0000_1010 |
| 0000_1101 | D14-0 | D13-1 | D12-2 | D11-3 | D10-4 | D9-5 | D8-6 | D7-7 | E6-0 | E5-1 | E4-2 | E3-3 | E2-4 | 0000_1011 |
| 0001_0001 | D18-0 | D17-1 | D16-2 | D15-3 | D14-4 | D13-5 | D12-6 | D11-7 | E10-0 | E9-1 | E8-2 | E7-3 | E6-4 | 0000_1100 |
| 0001_0101 | D22-0 | D21-1 | D20-2 | D19-3 | D18-4 | D17-5 | D16-6 | D15-7 | E14-0 | E13-1 | E12-2 | E11-3 | E10-4 | 0000_1101 |
| 0001_1001 | D26-0 | D25-1 | D24-2 | D23-3 | D22-4 | D21-5 | D20-6 | D19-7 | E18-0 | E17-1 | E16-2 | E15-3 | E14-4 | 0000_1110 |
| 0001_1101 | D30-0 | D29-1 | D28-2 | D27-3 | D26-4 | D25-5 | D24-6 | D23-7 | E22-0 | E21-1 | E20-2 | E19-3 | E18-4 | 0000_1111 |
| 0000_0010 | D3-0 | D2-1 | D1-2 | | | | | | | | | | 0001_0000 |
| 0000_0110 | D7-0 | D6-1 | D5-2 | D4-3 | D3-4 | D2-5 | D1-6 | | | | | | 0001_0001 |
| 0000_1010 | D11-0 | D10-1 | D9-2 | D8-3 | D7-4 | D6-5 | D5-6 | D4-7 | E3-0 | E2-1 | E1-2 | | | 0001_0010 |
| 0000_1110 | D15-0 | D14-1 | D13-2 | D12-3 | D11-4 | D10-5 | D9-6 | D8-7 | E7-0 | E6-1 | E5-2 | E4-3 | E3-4 | 0001_0011 |
| 0001_0010 | D19-0 | D18-1 | D17-2 | D16-3 | D15-4 | D14-5 | D13-6 | D12-7 | E11-0 | E10-1 | E9-2 | E8-3 | E7-4 | 0001_0100 |
| 0001_0110 | D23-0 | D22-1 | D21-2 | D20-3 | D19-4 | D18-5 | D17-6 | D16-7 | E15-0 | E14-1 | E13-2 | E12-3 | E11-4 | 0001_0101 |
| 0001_1010 | D27-0 | D26-1 | D25-2 | D24-3 | D23-4 | D22-5 | D21-6 | D20-7 | E19-0 | E18-1 | E17-2 | E16-3 | E15-4 | 0001_0110 |
| 0001_1110 | D31-0 | D30-1 | D29-2 | D28-3 | D27-4 | D26-5 | D25-6 | D24-7 | E23-0 | E22-1 | E21-2 | E20-3 | E19-4 | 0001_0111 |
| 0000_0011 | D4-0 | D3-1 | D2-2 | D1-3 | | | | | | | | | 0001_1000 |
| 0000_0111 | D8-0 | D7-1 | D6-2 | D5-3 | D4-4 | D3-5 | D2-6 | D1-7 | | | | | 0001_1001 |
| 0000_1011 | D12-0 | D11-1 | D10-2 | D9-3 | D8-4 | D7-5 | D6-6 | D5-7 | E4-0 | E3-1 | E2-2 | E1-3 | | 0001_1010 |
| 0000_1111 | D16-0 | D15-1 | D14-2 | D13-3 | D12-4 | D11-5 | D10-6 | D9-7 | E8-0 | E7-1 | E6-2 | E5-3 | E4-4 | 0001_1011 |
| 0001_0011 | D20-0 | D19-1 | D18-2 | D17-3 | D16-4 | D15-5 | D14-6 | D13-7 | E12-0 | E11-1 | E10-2 | E9-3 | E8-4 | 0001_1100 |
| 0001_0111 | D24-0 | D23-1 | D22-2 | D21-3 | D20-4 | D19-5 | D18-6 | D17-7 | E16-0 | E15-1 | E14-2 | E13-3 | E12-4 | 0001_1101 |
| 0001_1011 | D28-0 | D27-1 | D26-2 | D25-3 | D24-4 | D23-5 | D22-6 | D21-7 | E20-0 | E19-1 | E18-2 | E17-3 | E16-4 | 0001_1110 |
| 0001_1111 | D32-0 | D31-1 | D30-2 | D29-3 | D28-4 | D27-5 | D26-6 | D25-7 | E24-0 | E23-1 | E22-2 | E21-3 | E20-4 | 0001_1111 |

DATA STORAGE APPARATUS AND METHOD FOR STORING DATA

CROSS-REFERENCE TO RELATED APPLICATION

This application is based upon and claims the benefit of priority of the prior Japanese Patent Application No. 2013-063085, filed on Mar. 25, 2013, the entire contents of which are incorporated herein by reference.

FIELD

The embodiment discussed herein is related to a data storage apparatus and a method for storing data.

BACKGROUND

When radiation such as high-energy neutrons, thermal neutrons, or alpha particles is radiated onto a semiconductor integrated circuit, a soft error, in which data is inverted, might occur (for example, refer to C. Horikiri "Urgent Need for Countermeasures against Soft Errors: SRAMs and Logical Circuits", Nikkei Electronics, Nikkei Business Publications, Inc., Japan, Jul. 4, 2005, Issue 903, pp. 63-70 and Y. Tosaka "The Facts of Soft Errors You Should Know: History, Evaluation Method, and Countermeasures", Nikkei Electronics, Nikkei Business Publications, Inc., Japan, Jul. 4, 2005, Issue 903, pp. 145-156). Currently, a semiconductor integrated circuit apparatus has been disclosed in which memory cells that store data read in the same cycle are arranged away from one another in order to keep a plurality of pieces of bit data read in the same cycle from being inverted even if an soft error occurs (for example, refer to Japanese Laid-open Patent Publication No. 2000-268560). In addition, in a semiconductor storage device such as a flash memory, a technique for increasing the reliability of stored data by rearranging data of a plurality of bits and separately storing the data in a plurality of physical storage regions has been disclosed (for example, refer to Japanese Laid-open Patent Publication No. 2005-234883).

SUMMARY

According to an aspect of the invention, a data storage apparatus includes: a memory configured to store data; an input delay circuit configured to input a set of data of a plurality of bits into the memory at different timings between the plurality of bits by adding different delays to the plurality of bits in the set of data or by adding different delays to bits in bit groups obtained by grouping the plurality of bits in units of a consecutive bits; and an output delay circuit configured to obtain an original set of data, which is the set of data before the input delay circuit adds the different delays, by adding, to the plurality of bits in the set of data output from the memory, delays having a pattern opposite that of the delays added by the input delay circuit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4 is a diagram illustrating the configuration of an input side in a second example of the data storage apparatus according to the embodiment;

FIG. 5 is a diagram illustrating the configuration of an output side in the second example of the data storage apparatus according to the embodiment;

FIG. 6 is a diagram schematically illustrating the data structure of a data stream;

FIG. 8 is a diagram illustrating an example of a storage image of data in the FIFO memory;

FIG. 12 is a diagram illustrating an example of a storage image of data in the FIFO memory in the third example illustrated in FIG. 11;

FIG. 15 is a diagram illustrating an example of a storage image of data in a memory having the connection relationships between the address lines illustrated in FIG. 14;

DESCRIPTION OF EMBODIMENT

Figure 1:
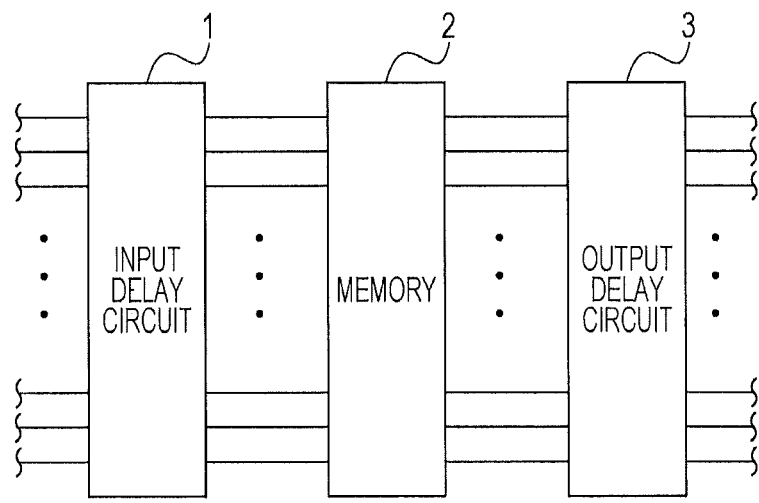
FIG. 1 is a diagram illustrating a first example of a data storage apparatus according to an embodiment.

When memory cells are arranged away from one another, there are problems in that operation speed decreases due to an increase in wiring delay and price becomes high. In addition, when data of a plurality of bits are stored in a plurality of physical storage regions in order to cope with soft errors, the same number of physical memories as the number of bits of the data has to be used, and accordingly if the amount of logical memory used is smaller than the amount achieved by the physical memories, a problem arises in that unused regions are generated in the physical memories. That is, even if the arrangement of memory cells is adjusted or a plurality of physical storage regions are provided in order to cope with soft errors, there are still problems to be solved.

A data storage apparatus and a method for storing data according to a preferred embodiment capable of increasing the tolerance of a memory to soft errors will be described in detail hereinafter with reference to the accompanying drawings. In the following description of examples, the same components are given the same reference numerals and redundant description is omitted.

First Example of Data Storage Apparatus

Figure 2:
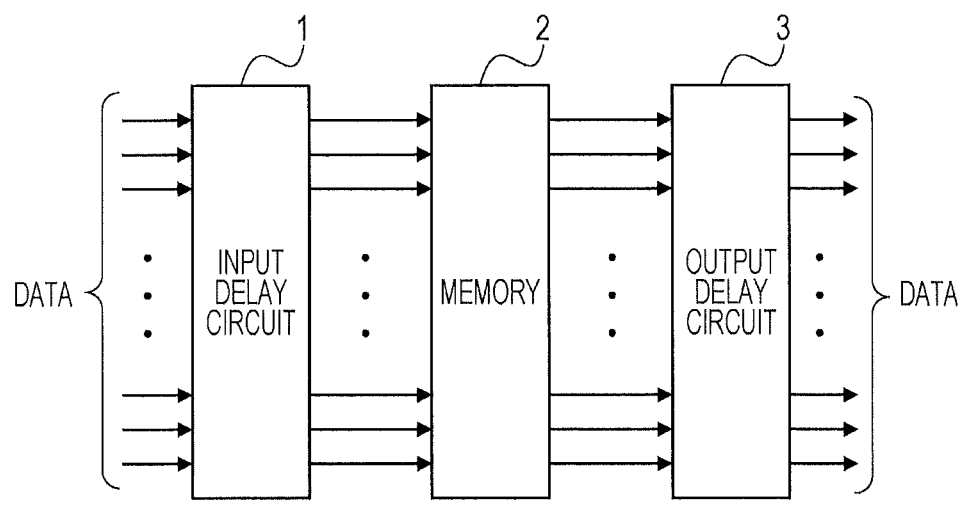
FIG. 2 is a diagram illustrating directions of signals in the data storage apparatus illustrated in FIG. 1.

FIG. 1 is a diagram illustrating a first example of the data storage apparatus according to the embodiment. FIG. 2 is a diagram illustrating directions of signals in the data storage apparatus illustrated in FIG. 1. As illustrated in FIGS. 1 and 2, the data storage apparatus includes an input delay circuit 1, a memory 2, and an output delay circuit 3.

The input delay circuit 1 is connected to a data source in a previous stage, which is not illustrated. The input delay circuit 1 inputs a set of data of a plurality of bits into the memory 2 at timings different between the plurality of bits by adding different delays to the plurality of bits. Alternatively, the input delay circuit 1 may input the set of data of the plurality of bits into the memory 2 at timings different between the plurality of bits by adding different delays to bits in groups obtained by grouping the plurality of bits in units of a plurality of consecutive bits.

The memory 2 is connected to the input delay circuit 1. The memory 2 stores the set of data output from the input delay circuit 1. The output delay circuit 3 is connected to the memory 2. The output delay circuit 3 obtains an original set of data, which is the set of data before the input delay circuit 1 adds the different delays, by adding, to the set of data of the plurality of bits output from the memory 2, delays having a pattern opposite that of the delays added by the input delay circuit 1.

Example of Method for Storing Data

Figure 3:
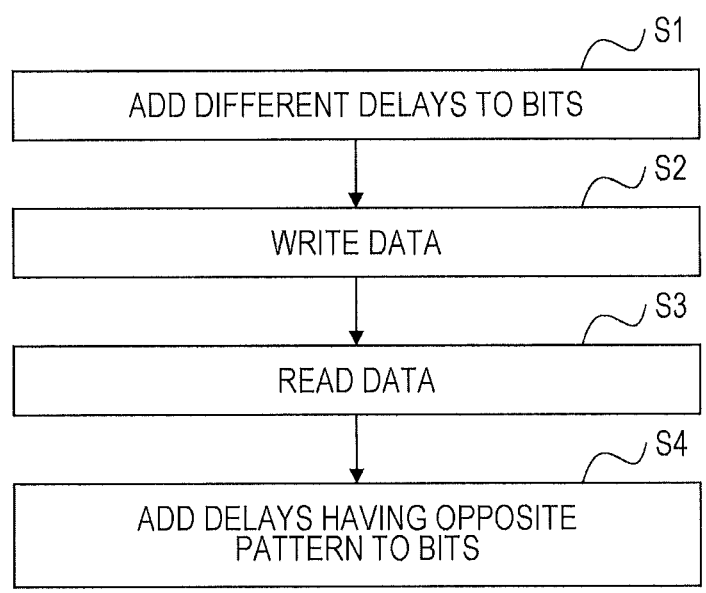
FIG. 3 is a diagram illustrating an example of a method for storing data according to the embodiment.

FIG. 3 is a diagram illustrating an example of the method for storing data according to the embodiment. The method for storing data illustrated in FIG. 3 may be realized by the data storage apparatus illustrated in FIG. 1. In this example, it is assumed that the method for storing data illustrated in FIG. 3 is realized by the data storage apparatus illustrated in FIG. 1.

As illustrated in FIG. 3, when a set of data of a plurality of bits has been input to the data storage apparatus, the input delay circuit 1 adds different delays to the plurality of bits in the set of data. Alternatively, the input delay circuit 1 may add different delays to bits in groups obtained by grouping the plurality of bits in the set of data in units of a plurality of consecutive bits (operation S1).

When the set of data has been input into the memory 2 at different timings caused by the delays added in operation S1, the set of data is written into the memory 2 (operation S2).

When the set of data is read, first, the set of data is read from the memory 2 (operation S3). Next, the output delay circuit 3 adds, to the plurality of bits in the set of data output from the memory 2, delays having a pattern opposite that of the delays added when the set of data is input into the memory 2. In doing so, the set of data output from the memory 2 returns to the original set of data, which is the set of data before the different delays are added during the inputting (operation S4).

According to the data storage apparatus illustrated in FIG. 1 or the method for storing data illustrated in FIG. 3, a set of data is written into the memory 2 at different timings between bits. Therefore, in the set of data, the numbers of bits stored in memory cells of the memory 2 having the same addresses become to 1 or smaller than the numbers of bits at a time when a set of data is stored without adding delays to the set of data using the input delay circuit 1. Therefore, in the set of data, the numbers of bits stored in the memory cells of the memory 2 having the same addresses may be kept to a value at which correction may be performed using an error-correcting code. Accordingly, even if errors occur in a plurality of memory cells of the memory 2 having the same addresses due to radiation, the number of errors in the set of data output from the output delay circuit 3 may be kept to a value at which the errors may be corrected using an error-correcting code, which makes it possible to correct the errors. That is, the tolerance of the memory 2 to soft errors may be increased.

The data storage apparatus illustrated in FIG. 1 may be applied to an apparatus that sequentially writes or sequentially reads a chronologically arranged, continuously supplied data stream to or from a memory such as a first-in, first-out (FIFO) memory. In the following description, it is assumed that the data storage apparatus illustrated in FIG. 1 is applied to an apparatus that sequentially writes and sequentially reads a data stream to and from a FIFO memory.

Second Example of Data Storage Apparatus

FIG. 4 is a diagram illustrating the configuration of an input side in a second example of the data storage apparatus according to the embodiment. FIG. 5 is a diagram illustrating the configuration of an output side in the second example of the data storage apparatus according to the embodiment. Although not particularly limited, it is assumed in this example that the bit width of a data stream is, for example, 8 bits and, for example, 5-bit error-correcting codes are provided for the 8-bit data.

As illustrated in FIGS. 4 and 5, the data storage apparatus includes a FIFO input data delay circuit 11, a FIFO memory 12, a FIFO output data delay circuit 13, an error-correcting code generation circuit 14, an error correction circuit 15, and an error detection circuit 16. The FIFO input data delay circuit 11 is an example of the input delay circuit. The FIFO memory 12 is an example of the memory. The FIFO output data delay circuit 13 is an example of the output delay circuit.

The error-correcting code generation circuit 14 is connected to an input data stream source in a previous stage, which is not illustrated. The error-correcting code generation circuit 14 generates, for example, 5-bit error-correcting codes Ei-0 to Ei-4 for 8-bit data Di-0 to Di-7 simultaneously input in an input data stream. The 8-bit data Di-0 to Di-7 and the 5-bit error-correcting codes Ei-0 to Ei-4 simultaneously input to the FIFO input data delay circuit 11 together form a set of data. Extended hamming codes, which are single-error correcting and double-error detecting codes, are an example of the error-correcting codes. The error-correcting codes are not limited to the extended hamming codes.

The FIFO input data delay circuit 11 is connected to the input data stream source in the previous stage, which is not illustrated, and the error-correcting code generation circuit 14. The FIFO input data delay circuit 11 adds different delays to the 8-bit data Di-0 to Di-7 and the 5-bit error-correcting codes Ei-0 to Ei-4. In the example illustrated in FIG. 4, for example, the FIFO input data delay circuit 11 includes different numbers of flip-flops FF for the 8-bit data Di-0 to Di-7 and the 5-bit error-correcting codes Ei-0 to Ei-4.

For example, the number of flip-flops FF provided for the data Di-0 is zero. One flip-flop FF is provided for the data Di-1. Two, three, four, five, six, and seven flip-flops FF are provided for the data Di-2, Di-3, Di-4, Di-5, Di-6, and Di-7, respectively. Eight, nine, ten, eleven, and twelve flip-flops FF are provided for the data Ei-0, Ei-1, Ei-2, Ei-3, and Ei-4, respectively.

In the example illustrated in FIG. 4, the data Di-0 in the 8-bit data Di-0 to Di-7 simultaneously input in the input data stream is input, for example, to a zero data input terminal of the FIFO memory 12 as input data Dfi-0 without delay. The data Di-1 is input, for example, to a first data input terminal of the FIFO memory 12 as input data Dfi-1 with a one-cycle delay. The data Di-2, Di-3, Di-4, Di-5, Di-6, and Di-7 are input, for example, to second, third, fourth, fifth, sixth, and seventh data input terminals of the FIFO memory 12 as input data Dfi-2, Dfi-3, Dfi-4, Dfi-5, Dfi-6, and Dfi-7 with two-cycle, three-cycle, four-cycle, five-cycle, six-cycle, and seven-cycle delays, respectively.

In addition, the data Ei-0 among the 5-bit error-correcting codes Ei-0 to Ei-4 for the 8-bit data simultaneously input in the input data stream is input, for example, to an eighth data input terminal of the FIFO memory 12 as input data Efi-0 with an eight-cycle delay. The data Ei-1, Ei-2, Ei-3, and Ei-4 are input, for example, to ninth, tenth, eleventh, and twelfth data input terminals of the FIFO memory 12 as input data Efi-1, Efi-2, Efi-3, and Efi-4 with nine-cycle, ten-cycle, eleven-cycle, and twelve-cycle delays, respectively.

The FIFO output data delay circuit 13 is connected to the FIFO memory 12. The FIFO output data delay circuit 13 adds, to 8-bit data Dfo-0 to Dfo-7 and 5-bit error-correcting codes Efo-0 to Efo-4 simultaneously read from the FIFO memory 12, delays having a pattern opposite that of the delays added by the FIFO input data delay circuit 11. In the example illustrated in FIG. 5, for example, the FIFO output data delay circuit 13 includes different numbers of flip-flops FF for the 8-bit output data Dfo-0 to Dfo-7 and the 5-bit error-correcting codes Efo-0 to Efo-4.

For example, twelve flip-flops FF are provided for the output data Dfo-0. Eleven, ten, nine, eight, seven, six, and five flip-flops FF are provided for the data Dfo-1, Dfo-2, Dfo-3, Dfo-4, Dfo-5, Dfo-6, and Dfo-7, respectively. Four, three, two, and one flip-flops FF are provided for the output data Efo-0, Efo-1, Efo-2, and Efo-3, respectively. The number of flip-flops FF provided for the output data Efo-4 is zero.

In the example illustrated in FIG. 5, the output data Dfo-0 in the 8-bit output data Dfo-0 to Dfo-7 simultaneously read from the FIFO memory 12 is output from the FIFO output data delay circuit 13 as output data Do-0 with a twelve-cycle delay. The output data Dfo-1, Dfo-2, Dfo-3, Dfo-4, Dfo-5, Dfo-6, and Dfo-7 are output from the FIFO output data delay circuit 13 as output data Do-1, Do-2, Do-3, Do-4, Do-5, Do-6, and Do-7 with eleven-cycle, ten-cycle, nine-cycle, eight-cycle, seven-cycle, six-cycle, and five-cycle delays, respectively.

In addition, the output data Efo-9 among the 5-bit error-correcting codes Efo-0 to Efo-4 simultaneously read from the FIFO memory 12 along with the 8-bit output data Dfo-0 to Dfo-7 is output from the FIFO output data delay circuit 13 as output data Eo-0 with a four-cycle delay. The output data Efo-1, Efo-2, and Efo-3 is output from the FIFO output data delay circuit 13 as output data Eo-1, Eo-2, and Eo-3 with three-cycle, two-cycle, and one-cycle delays, respectively. The output data Efo-4 is output from the FIFO output data delay circuit 13 as output data Eo-4 without delay.

The error detection circuit 16 is connected to the FIFO output data delay circuit 13. The error detection circuit 16 detects errors in the 8-bit output data Do-0 to Do-7 output from the FIFO output data delay circuit 13 at the same time as the error-correcting codes Eo-0 to Eo-4 using the 5-bit error-correcting codes Eo-0 to Eo-4 output from the FIFO output data delay circuit 13.

The error correction circuit 15 is connected to the FIFO output data delay circuit 13 and the error detection circuit 16. The error correction circuit 15 corrects the errors in the 8-bit output data Do-0 to Do-7 output from the FIFO output data delay circuit 13 on the basis of results of the error detection output from the error detection circuit 16, and outputs an output data stream having an 8-bit width.

Figure 7:
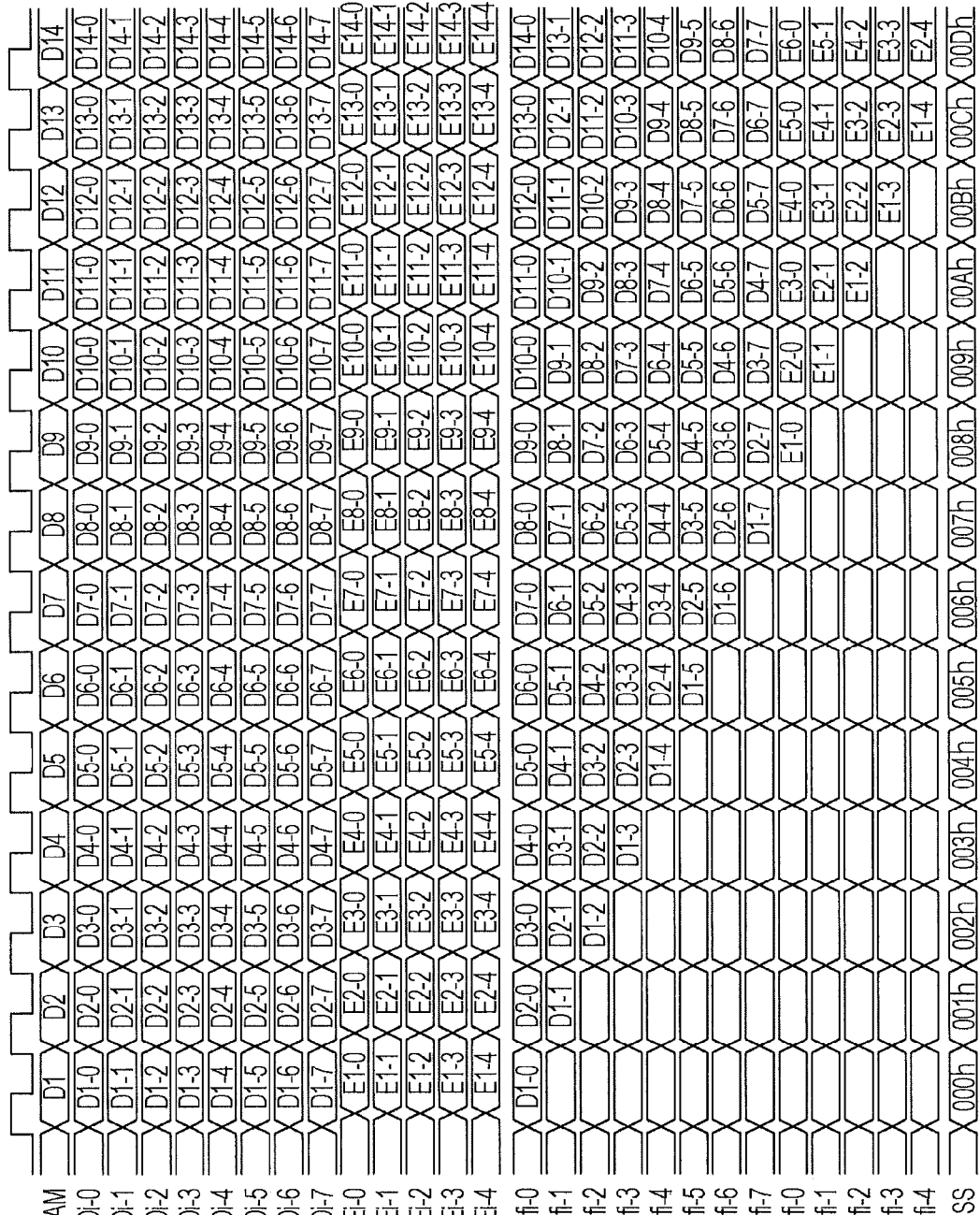
FIG. 7 is a diagram illustrating an example of operation timings at a time when the data stream illustrated in FIG. 6 is written to a FIFO memory.

FIG. 6 is a diagram schematically illustrating the data structure of a data stream having a 13-bit width, which is sets of data each including a data stream having an 8-bit width and 5-bit error-correcting codes. FIG. 7 is a diagram illustrating operation timings at a time when the data stream illustrated in FIG. 6 is written to the FIFO memory 12.

As illustrated in FIG. 6 and an upper part of FIG. 7, 8-bit data Dn-0 to Dn-7 and 5-bit error-correcting codes En-0 to En-4 for the 8-bit data Dn-0 to Dn-7 are simultaneously input to the FIFO input data delay circuit 11. As illustrated in a lower part of FIG. 7, the data Dn-0 to Dn-7 and En-0 to En-4 simultaneously input to the FIFO input data delay circuit 11 is written to the FIFO memory 12, for example, with delays that are different from one another by one cycle. When a timing at which data is written to the FIFO memory 12 is delayed by one cycle, a FIFO memory write address increases by one.

Therefore, for example, the data D1-0, D1-1, D1-2 D1-3, D1-4, D1-5, D1-6, and D1-7 is stored in memory cells having FIFO memory write addresses 000h, 001h, 002h, 003h, 004h, 005h, 006h, and 007h, respectively. In addition, the data E1-0, E1-1, E1-2, E1-3, and E1-4 is stored in memory cells having FIFO memory write addresses 008h, 009h, 00Ah, 00Bh, and 00Ch, respectively.

In addition, for example, the data D2-0, D2-1, D2-2, D2-3, D2-4, D2-5, D2-6, and D2-7 is stored in the memory cells having the FIFO memory write addresses 001h, 002h, 003h, 004h, 005h, 006h, 007h, and 008h, respectively. In addition, the data E2-0, E2-1, E2-2, E2-3, and E2-4 is stored in memory cells having FIFO memory write addresses 009h, 00Ah, 00Bh, 00Ch, and 00Dh, respectively. The data D3-0 to D3-7, E3-0 to E3-4, and later is also stored in memory cells having FIFO memory write addresses that are different from one another by one.

FIG. 8 is a diagram illustrating an example of a storage image of data in the FIFO memory 12 at a time when the data stream illustrated in FIG. 6 has been written to the FIFO memory 12 at the operation timings illustrated in FIG. 7. Since the timing at which the data is written to the FIFO memory 12 is delayed by one cycle and the FIFO memory write address increases by one, the storage image of the data in the FIFO memory 12 is as illustrated in FIG. 8. The set of 13-bit data Dn-0 to Dn-7 and En-0 to En-4 is diagonally stored.

Figure 9:
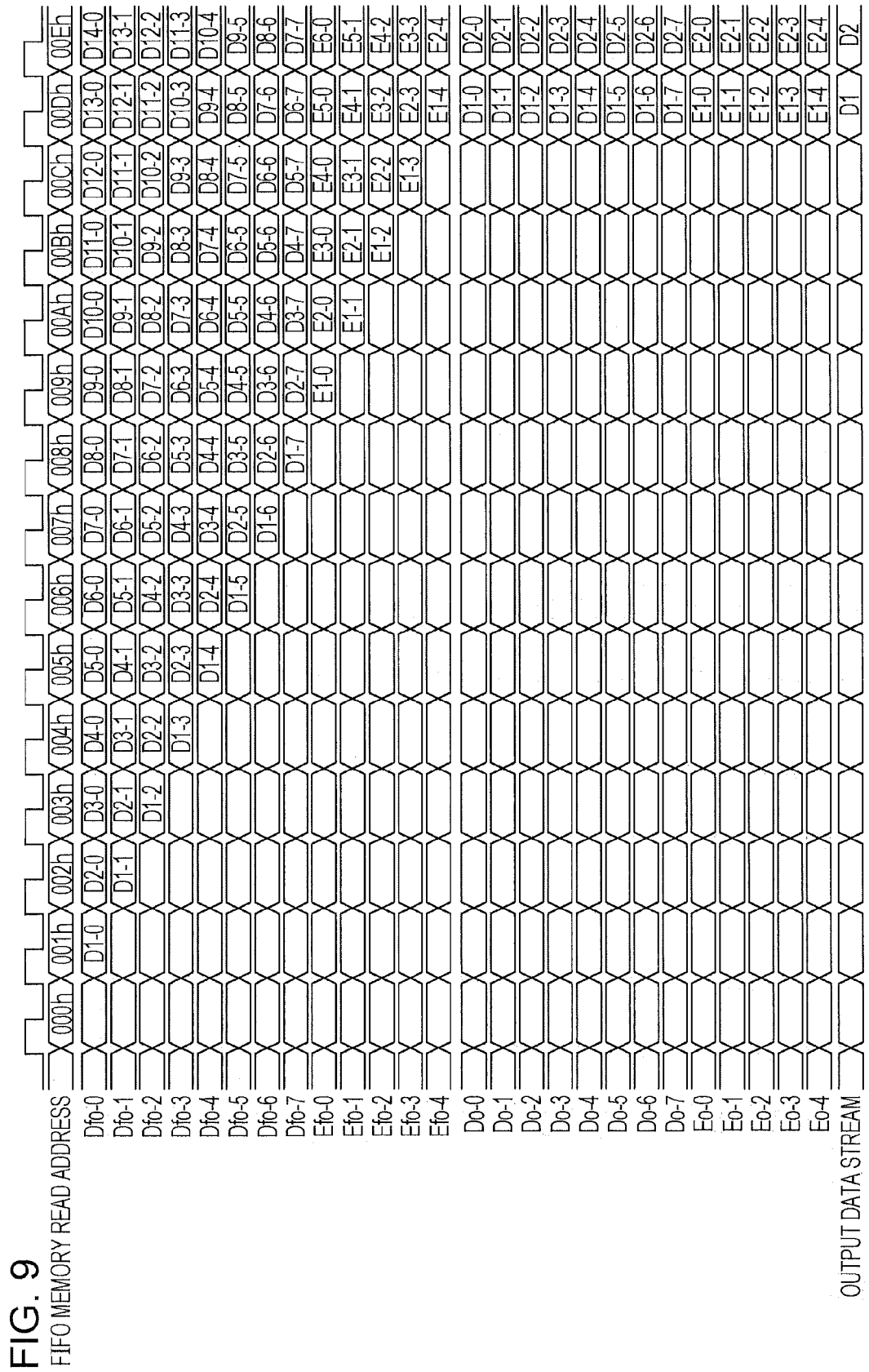
FIG. 9 is a diagram illustrating an example of operation timings at a time when the data is read from the FIFO memory.

FIG. 9 is a diagram illustrating an example of operation timings at a time when the data in the storage image illustrated in FIG. 8 is read from the FIFO memory 12. As illustrated in an upper part of FIG. 9, data specified by FIFO memory read addresses is read from the FIFO memory 12. In the FIFO memory 12, the set of 13-bit data Dn-0 to Dn-7 and En-0 to En-4 is diagonally stored as illustrated in FIG. 8. When a timing at which data is read from the FIFO memory 12 is advanced by one cycle, the FIFO memory write address increases by one. Therefore, the data Dn-0 to Dn-7 and En-0 to En-4 is read from the FIFO memory 12, for example, with delays that are different from one another by one cycle.

Therefore, for example, the data D1-0, D1-1, D1-2, D1-3, D1-4, D1-5, D1-6, and D1-7 is read from the FIFO memory 12, for example, with delays that are different from one another by one cycle using FIFO memory read addresses 001h, 002h, 003h, 004h, 005h, 006h, 007h, and 008h, respectively. In addition, the data E1-0, E1-1, E1-2, E1-3, and E1-4 is read from the FIFO memory 12, for example, with delays that are different from one another using FIFO memory read addresses 009h, 00Ah, 00Bh, 00Ch, and 00Dh, respectively.

In addition, for example, the data D2-0, D2-1, D2-2, D2-3, D2-4, D2-5, D2-6, and D2-7 is read from the FIFO memory 12, for example, with delays that are different from one another by one cycle using the FIFO memory read addresses 002h, 003h, 004h, 005h, 006h, 007h, 008h, and 009h, respectively. In addition, the data E2-0, E2-1, E2-2, E2-3, and E2-4 is read from the FIFO memory 12, for example, with delays that are different from one another by one cycle using FIFO memory read addresses 00Ah, 00Bh, 00Ch, 00Dh, and 00Eh, respectively. The data D3-0 to D3-7, E3-0 to E3-4, and later is also read from the FIFO memory 12 with delays that are different from one another by one cycle.

The FIFO output data delay circuit 13 adds, to the data Dn-0 to Dn-7 and En-0 to En-4 read from the FIFO memory 12 with delays that are different from one another by one cycle, delays having a pattern opposite that of the delays added by the FIFO input data delay circuit 11. Therefore, as illustrated in a lower part of FIG. 9, the data Dn-0 to Dn-7 and En-0 to En-4 read from the FIFO memory 12 returns to an original set of data, which is a set of data before being input to the FIFO input data delay circuit 11.

For example, the data D1-0 read using the FIFO memory read address 001h is delayed by the twelve flip-flops FF of the FIFO output data delay circuit 13 by twelve cycles. As a result, the data D1-0 is output from the FIFO output data delay circuit 13 at the same time as the data E1-4 read using the FIFO memory read address 00Dh. In addition, the data D1-1 read using the FIFO memory read address 002h is delayed by the eleven flip-flops FF of the FIFO output data delay circuit 13 by eleven cycles. As a result, the data D1-1 is output from the FIFO output data delay circuit 13 at the same time as the data E1-4 read using the FIFO memory read address 00Dh. The data D1-2 to D1-7 and E1-0 to E1-3 is also output from the FIFO output data delay circuit 13 at the same time as the data E1-4 as a result of the delays added by the FIFO output data delay circuit 13.

According to the data storage apparatus illustrated in FIGS. 4 and 5, a set of data is written to the FIFO memory 12 at different timings between bits. Therefore, in a set of data, the numbers of bits stored in the memory cells of the FIFO memory 12 having the same addresses become one. Therefore, even if errors occur in the plurality of memory cells of the FIFO memory 12 having the same addresses due to radiation, the number of errors occurring in a set of data output from the FIFO output data delay circuit 13 may be kept to a value at which correction may be performed using an error-correcting code such as an extended hamming code, which makes it possible to correct the errors. That is, the tolerance of the FIFO memory 12 to soft errors may be increased.

Third Example of Data Storage Apparatus

Figure 10:
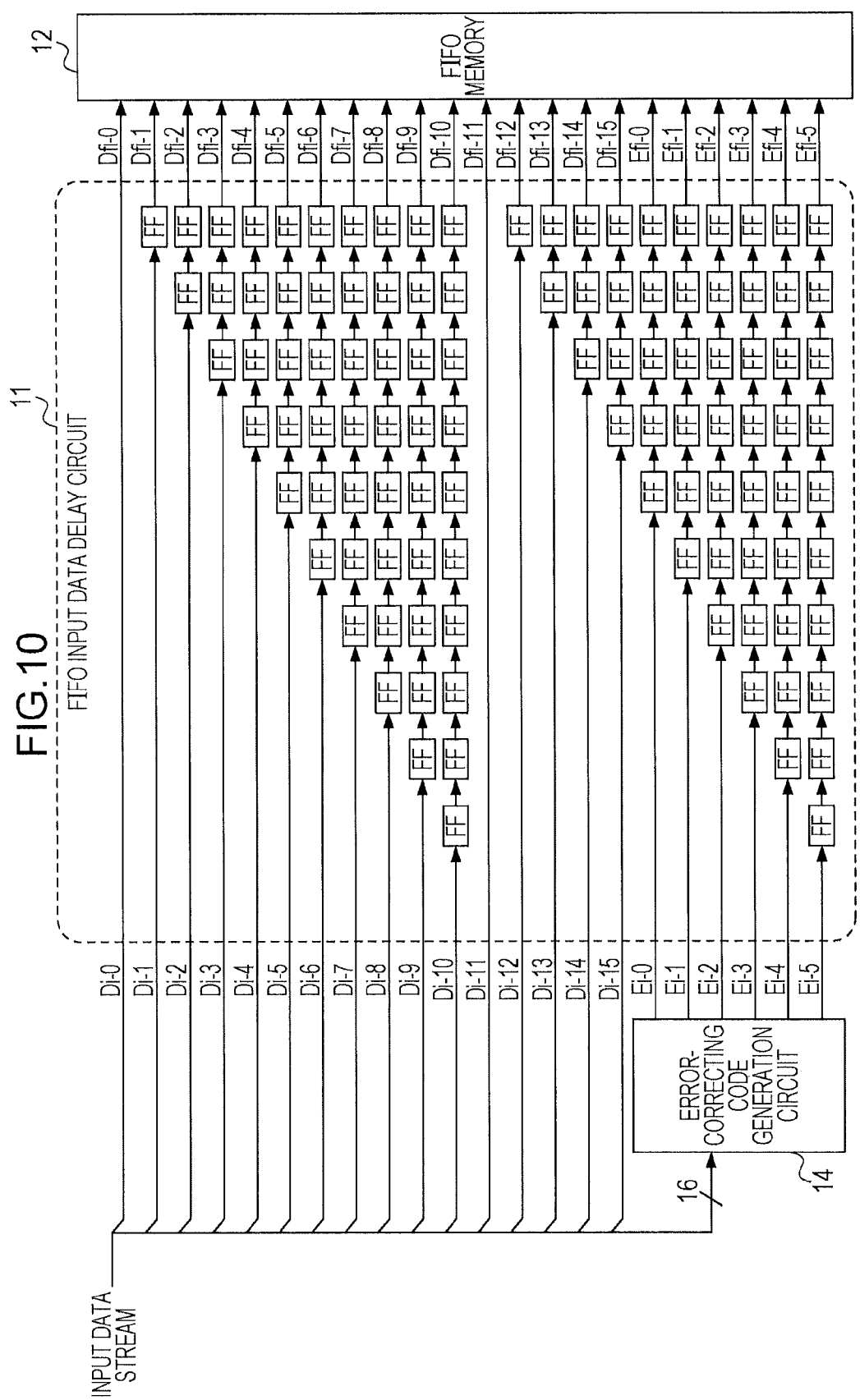
FIG. 10 is a diagram illustrating the configuration of an input side in a third example of the data storage apparatus according to the embodiment.
Figure 11:
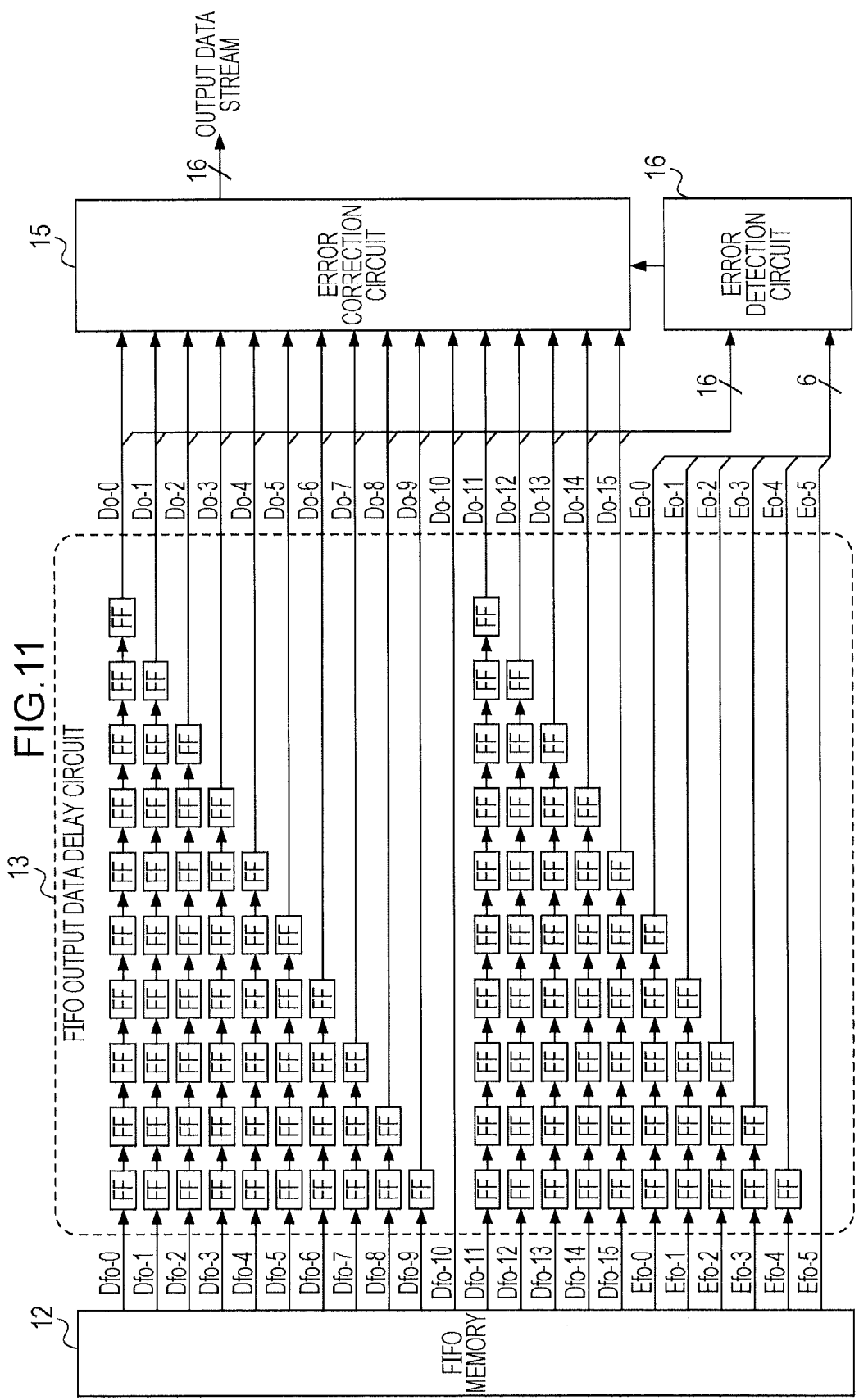
FIG. 11 is a diagram illustrating the configuration of an output side in the third example of the data storage apparatus according to the embodiment.

FIG. 10 is a diagram illustrating the configuration of an input side in a third example of the data storage apparatus according to the embodiment. FIG. 11 is a diagram illustrating the configuration of an output side in the third example of the data storage apparatus according to the embodiment. Although not particularly limited, it is assumed in this example that the bit width of a data stream is, for example, 16 bits and, for example, 6-bit error-correcting codes Ei-0 to Ei-5 are provided for 16-bit data Di-0 to Di-15.

As illustrated in FIG. 10, in the FIFO input data delay circuit 11, for example, the number of flip-flops FF provided for the data Di-0 is zero in the third example of the data storage apparatus. One, two three, four, five, six, seven, eight, nine, and ten flip-flops FF are provided for the data Di-1, Di-2, Di-3, Di-4, Di-5, Di-6, Di-7, Di-8, Di-9, and Di-10, respectively.

The number of flip-flops FF provided for the data Di-11 is zero. One, two, three, four, five, six, seven, eight, nine, and ten flip-flops FF are provided for the data Di-12, Di-13, Di-14, Di-15, Ei-0, Ei-1, Ei-2, Ei-3, and Ei-5, respectively.

As illustrated in FIG. 11, in the FIFO output data delay circuit 13, for example, ten, nine, eight, seven, six, five, four, three, two, and one flip-flops FF are provided for data Dfo-0, Dfo-1, Dfo-2, Dfo-3, Dfo-4, Dfo-5, Dfo-6, Dfo-7, Dfo-8, and Dfo-9, respectively, in the third example of the data storage apparatus. The number of flip-flops FF provided for data Dfo-10 is zero.

In addition, ten, nine, eight, seven, six, five, four, three, two, and one flip-flops FF are provided for data Dfo-11, Dfo-12, Dfo-13, Dfo-14, Dfo-15, Efo-0, Efo-1, Efo-2, Efo-3, and Efo-4, respectively. The number of flip-flops FF provided for data Efo-5 is zero. Other components and operation timings of writing and reading are the same as those in the second example illustrated in FIGS. 4 and 5, and accordingly redundant description is omitted.

Figure 12:
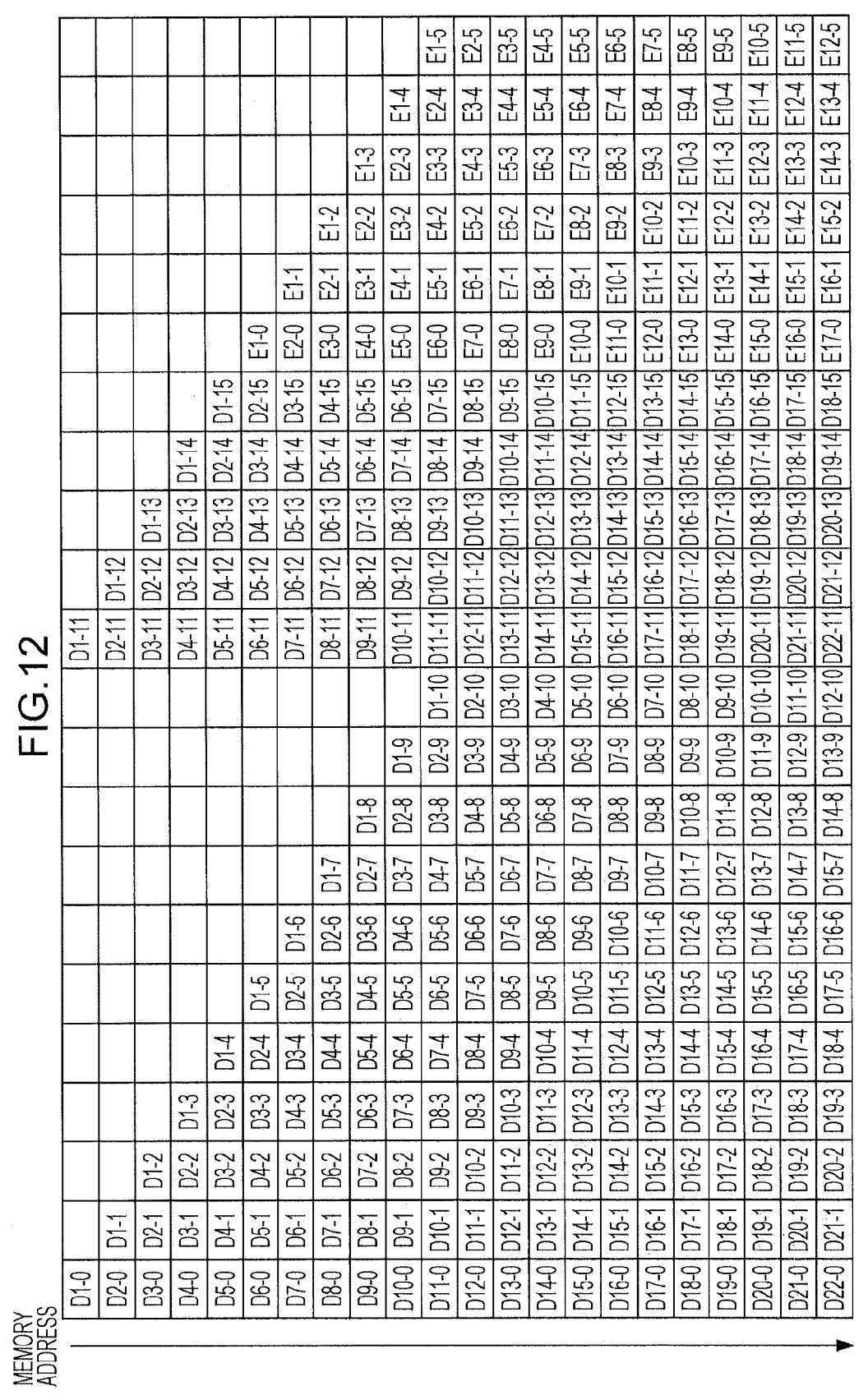

FIG. 12 is a diagram illustrating an example of a storage image of data in the FIFO memory 12 in the third example illustrated in FIG. 11. As illustrated in FIG. 12, 11-bit data Dn-0 to Dn-10 in 22-bit data Dn-0 to Dn-15 and En-0 to En-5 is diagonally stored, and the remaining 11-bit data Dn-11 to Dn-15 and En-0 to En-5 is diagonally stored. In Y. Tosaka "The Facts of Soft Errors You Should Know: History, Evaluation Method, and Countermeasures", Nikkei Electronics, Nikkei Business Publications, Inc., Japan, Jul. 4, 2005, Issue 903, pp. 145-156, it is described that as many as 7 bits of data are inverted in a memory array in a single soft error. In the third example, 2 bits of data in the set of 22-bit data Dn-0 to Dn-15 and En-0 to En-5 are stored in memory cells having the same memory addresses while being separated from each other by at least 8 bits.

Therefore, according to the data storage apparatus illustrated in FIGS. 10 and 11, it is possible to avoid simultaneous occurrence of errors in 2 bits of the set of data Dn-0 to Dn-15 and En-0 to En-5 stored in the memory cells of the FIFO memory 12 having the same memory addresses in a single soft error. Accordingly, even if a soft error occurs, the number of errors in a set of data output from the FIFO output data delay circuit 13 may be kept to a value at which correction may be performed using an error-correcting code, which makes it possible to correct the errors. That is, the tolerance of the FIFO memory 12 to soft errors may be increased.

First Example of Connection Relationships Between Address Lines

Figure 13:
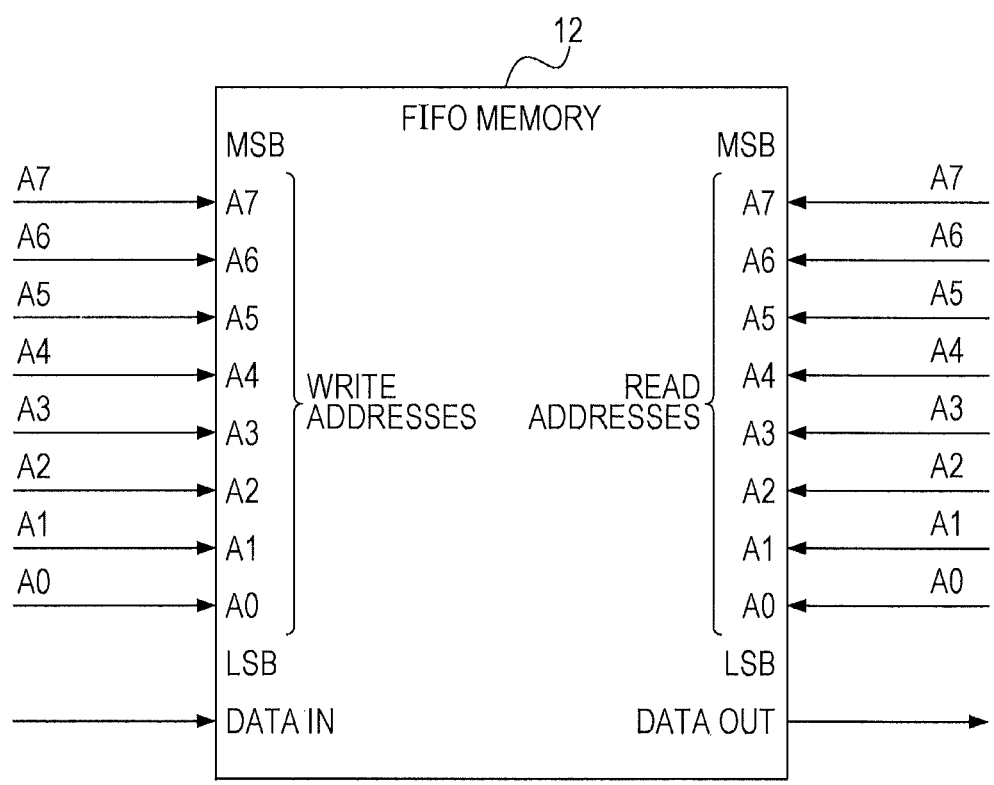
FIG. 13 is a diagram illustrating a first example of connection relationships between address lines at a time when a dual-port memory is used as the FIFO memory through address control.

FIG. 13 is a diagram illustrating a first example of connection relationships between address lines at a time when a dual-port memory is used as the FIFO memory 12 through address control. The first example illustrated in FIG. 13 may be applied to connection relationships between address lines in the second example of the data storage apparatus illustrated in FIGS. 4 and 5 or the third example of the data storage apparatus illustrated in FIGS. 10 and 11. In the example illustrated in FIG. 13, the dual-port memory is used as the FIFO memory 12 by controlling write addresses and read addresses of the dual-port memory. In this example, it is assumed that the number of bits, which indicates the addresses of a memory 12, is eight.

As illustrated in FIG. 13, write address terminals A7, A6, A5, A4, A3, A2, A1, and A0 of the memory 12 are connected, for example, to write address lines A7, A6, A5, A4, A3, A2, A1, and A0, respectively, on a substrate that provide the write addresses for the memory 12. In addition, read address terminals A7, A6, A5, A4, A3, A2, A1, and A0 of the memory 12 are connected, for example, to read address lines A7, A6, A5, A4, A3, A2, A1, and A0, respectively, on the substrate that provide the read addresses for the memory 12. Among the write addresses and the read addresses, the most significant bit (MSB) is A7 and the least significant bit (LSB) is A0.

Second Example of Connection Relationships Between Address Lines

Figure 14:
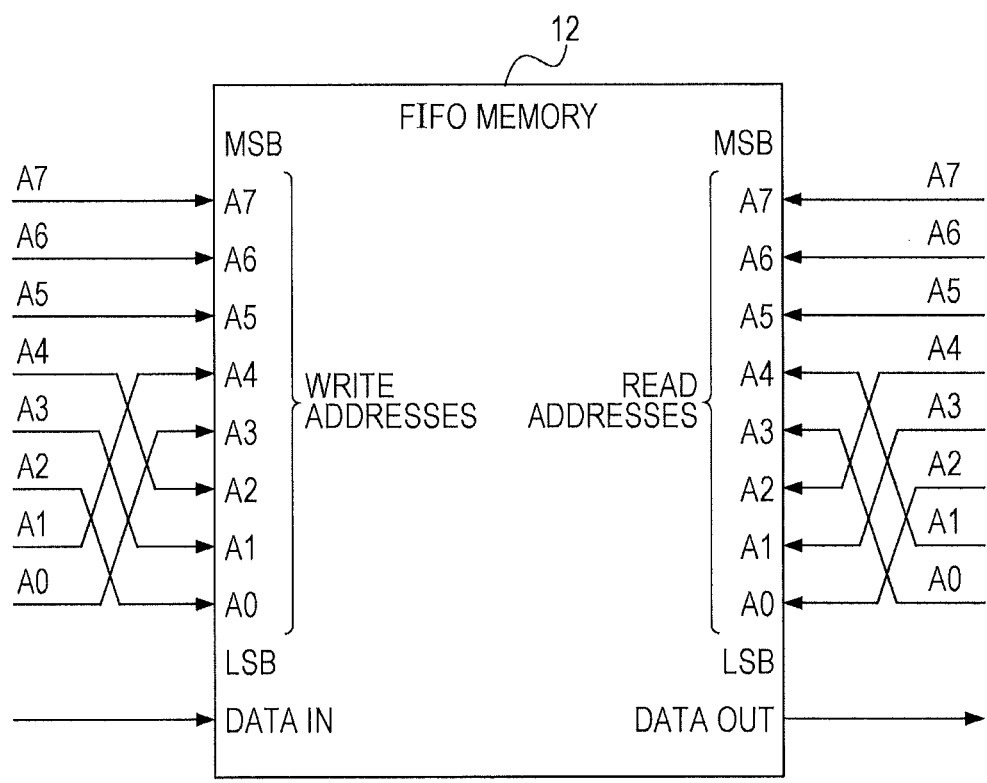
FIG. 14 is a diagram illustrating a second example of the connection relationships between the address lines at the time when the dual-port memory is used as the FIFO memory through the address control.

FIG. 14 is a diagram illustrating a second example of the connection relationships between the address lines at the time when the dual-port memory is used as the FIFO memory 12 through the address control. The second example illustrated in FIG. 14 may be applied to the connection relationships between the address lines in the second example of the data storage apparatus illustrated in FIGS. 4 and 5 or the third example of the data storage apparatus illustrated in FIGS. 10 and 11. In the example illustrated in FIG. 14, the dual-port memory is used as the FIFO memory 12 by controlling the write addresses and the read addresses of the dual-port memory. In this example, it is assumed that the number of bits, which indicates the addresses of the memory 12, is eight.

As illustrated in FIG. 14, the write address terminals A4, A3, A2, A1, and A0 of the memory 12 may be connected, for example, to the write address lines A2, A1, A0, A4, and A3, respectively, on the substrate that provide the write addresses for the memory 12. The write address terminals A7, A6, and A5 of the memory 12 may be connected, for example, to the write address lines A7, A6, and A5, respectively, on the substrate. That is, in the memory 12, the write addresses A1 and A0 on a substrate side may be provided as addresses higher than the write addresses A4, A3, and A2 on the substrate side.

In addition, the read address terminals A4, A3, A2, A1, and A0 of the memory 12 may be connected, for example, to the read address lines A2, A1, A0, A4, and A3, respectively, on the substrate that provide the read addresses for the memory 12. The read address terminals A7, A6, and A5 of the memory 12 may be connected, for example, to the read address lines A7, A6, and A5, respectively, on the substrate. That is, in the memory 12, the read addresses A1 and A0 on the substrate side may be provided as addresses higher than the read addresses A4, A3, and A2 on the substrate side.

FIG. 15 is a diagram illustrating an example of a storage image of data in the memory 12 having the connection relationships between the address lines illustrated in FIG. 14 in the second example of the data storage apparatus illustrated in FIGS. 4 and 5. As illustrated in FIG. 15, each bit of the set of data Dn-0 to Dn-7 and En-0 to En-4 is stored in the memory 12 at every eighth address. For example, the data D1-0 in the set of data D1-0 to D1-7 and E1-0 to E1-4 is stored in the memory 12 at the address 000h (0000_0000).

The data D1-1, D1-2, D1-3, D1-4, D1-5, D1-6, and D1-7 is stored in the memory 12 at addresses 008h (0000_1000), 010h (0001_0000), 018h (0001_1000), 001h (0000_0001), 009h (0000_1001), 011h (0001_0001), and 019h (0001_1001), respectively. In addition, the data E1-0, E1-1, E1-2, E1-3, and E1-4 is stored in the memory 12 at addresses 002h (0000_0010), 00Ah (0000_1010), 012h (0001_0010), 01Ah (0001_1010) and 003h (0000_0011), respectively.

According to Y. Tosaka "The Facts of Soft Errors You Should Know: History, Evaluation Method, and Countermeasures", Nikkei Electronics, Nikkei Business Publications, Inc., Japan, Jul. 4, 2005, Issue 903, pp. 145-156, the maximum magnitude of block-like data inversion in the memory array in a single soft error is assumed to be 4 bits in a horizontal direction by 4 bits in a vertical direction. For example, in the storage image of data illustrated in FIG. 15, the data D1-5 is focused upon. Data D1-$a$ or E1-$b$ included in the same set of data as the data D1-5 is not stored in a 4×4 bit range whose lower left corner is the data D1-5, lower right corner is the data E2-0, upper right corner is data E17-0, and upper left corner is data D20-5. Here, "a" is an integer of 0 to 7 and "b" is an integer of 0 to 4.

In addition, the data D1-$a$ or E1-$b$ included in the same set of data as the data D1-5 is not included in a 4×4 bit range whose upper left corner is the data D1-5, lower left corner is data D13-5, lower right corner is data E10-0, and upper right corner is the data E2-0. In addition, the data D1-$a$ or E1-$b$ included in the same set of data as the data D1-5 is not stored in a 4×4 bit range whose upper right corner is the data D1-5, upper left corner is data D4-2, lower left corner is data D16-2, and lower right corner is the data D13-5.

In addition, the data D1-$a$ or E1-$b$ included in the same set of data as the data D1-5 is not stored in a 4×4 bit range whose lower right corner is the data D1-5, upper right corner is the data D20-5, upper left corner is data D23-2, and lower left corner is the data D4-2. The same holds true for the other data D1-0 to D1-4, D1-6, D1-7, and E1-0 to E1-4 included in the same set of data as the data D1-5. Thus, in a range of 4 bits in the horizontal direction and 4 bits in the vertical direction, only one bit of data in the same set of data exists.

Therefore, according to the connection relationships between the address lines illustrated in FIG. 14, even if block-like soft errors occur in the memory 12, it is possible to avoid simultaneous occurrence of errors in two bits of the set of data Dn-0 to Dn-7 and En-0 to En-4. Accordingly, even if block-like soft errors occur, the number of errors in a set of data output from the FIFO output data delay circuit 13 may be kept to a value at which correction may be performed using an error-correcting code, which makes it possible to correct the errors. That is, the tolerance of the memory 12 to soft errors may be increased. The same holds true for a case in which the connection relationships between the address lines illustrated in FIG. 14 is applied to the third example of the data storage apparatus illustrated in FIGS. 10 and 11, and the same effects may be produced.

First Application Example of Data Storage Apparatus

Figure 16:
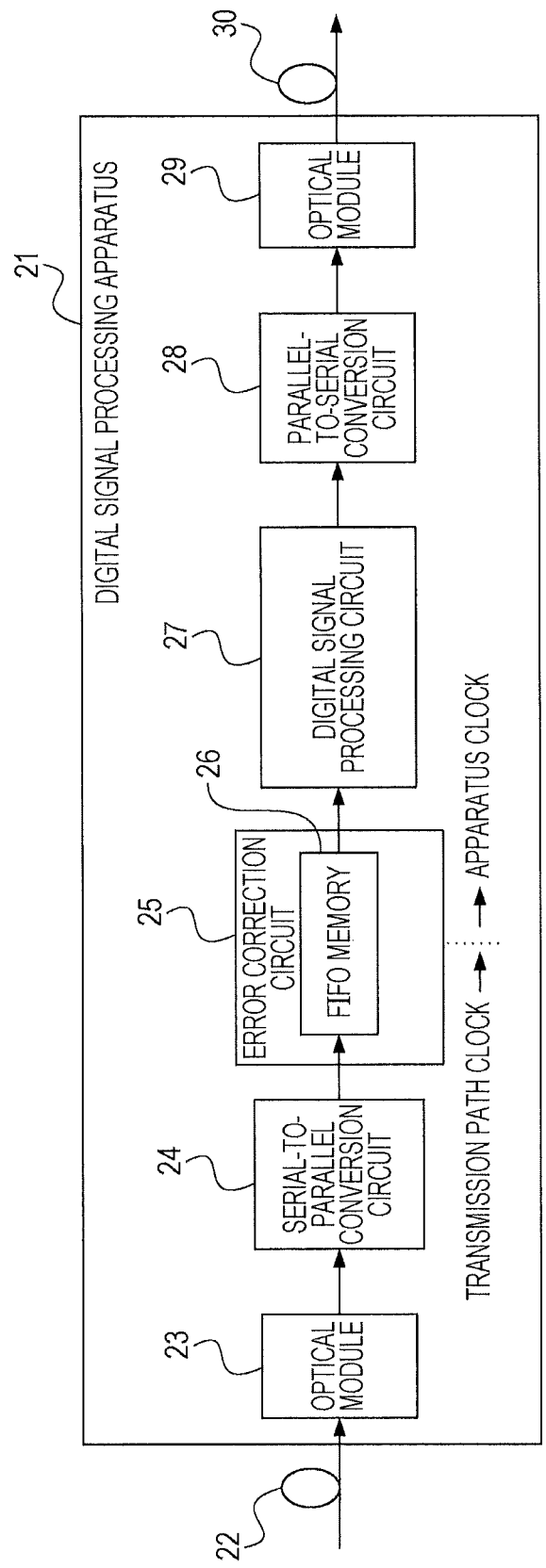
FIG. 16 is a diagram illustrating a first application example of the data storage apparatus according to the embodiment.

FIG. 16 is a diagram illustrating a first application example of the data storage apparatus according to the embodiment. As illustrated in FIG. 16, a FIFO memory 26 of a digital signal processing apparatus 21 is used for changing a clock domain from a transmission path clock to an apparatus clock. The digital signal processing apparatus 21 converts an optical signal input from an optical fiber 22 into an electrical serial signal using an optical module 23, and then converts the electrical serial signal into a parallel signal using a serial-to-parallel conversion circuit 24 and stores the parallel signal in the FIFO memory 26.

The FIFO memory 26 outputs a digital signal to a digital signal processing circuit 27. When the parallel signal is stored in the FIFO memory 26, an error correction circuit 25 generates an error-correcting code, and when the digital signal is output from the FIFO memory 26, error detection and error correction are performed using the error-correcting code. The digital signal processing apparatus 21 converts the processed digital signal output from the digital signal processing circuit 27 into a serial signal using a parallel-to-serial conversion circuit 28, and then converts the serial signal into an optical signal using an optical module 29 and transmits the optical signal to an optical fiber 30.

In the digital signal processing apparatus 21, the error correction circuit 25 includes the error-correcting code generation circuit 14, the error correction circuit 15, and the error detection circuit 16 of the data storage apparatus according to the embodiment. The FIFO memory 26 includes the FIFO memory 12 of the data storage apparatus according to the data storage apparatus.

Second Application Example of Data Storage Apparatus

Figure 17:
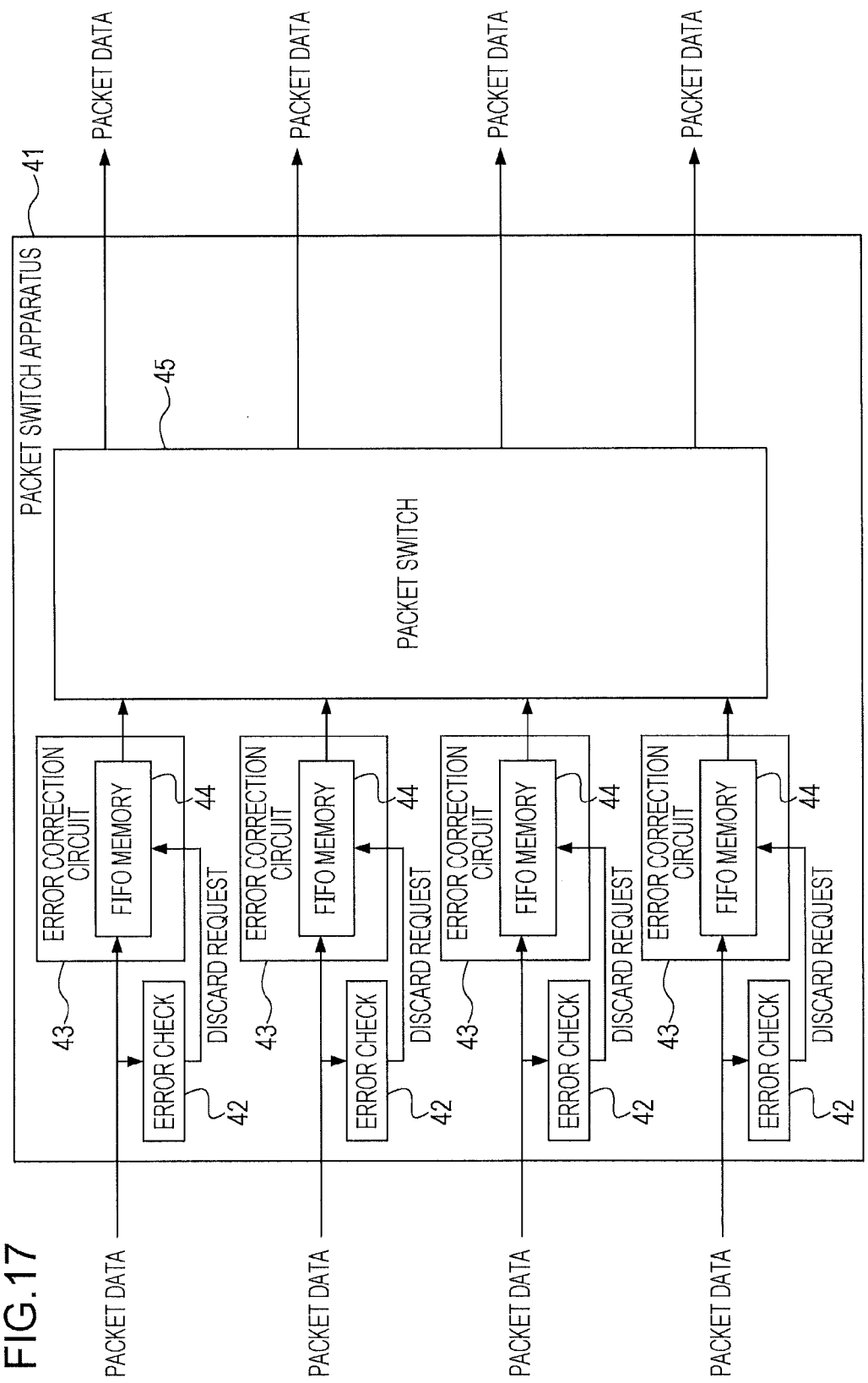
FIG. 17 is a diagram illustrating a second application example of the data storage apparatus according to the embodiment.

FIG. 17 is a diagram illustrating a second application example of the data storage apparatus according to the embodiment. As illustrated in FIG. 17, FIFO memories 44 in a packet switch apparatus 41 are used for temporarily accumulating packet data for a packet switch 45 using a store-and-forward method.

The packet switch apparatus 41 stores packet data input from a plurality of input ports in the FIFO memories 44. At this time, if error checks 42 detect errors in the packet data, the error checks 42 issue discard requests to discard the packet data from the FIFO memories 44. The FIFO memories 44 output packet data to the packet switch 45. When packet data is stored in the FIFO memories 44, error correction circuits 43 generate error-correcting codes, and when packet data is output from the FIFO memories 44, error detection and error correction are performed using the error-correcting codes. The packet switch apparatus 41 outputs the packet data while switching an output port to be used using the packet switch 45.

In the packet switch apparatus 41, the error correction circuits 43 each include the error-correcting code generation circuit 14, the error correction circuit 15, and the error detection circuit 16 of the data storage apparatus according to the embodiment. The FIFO memories 44 each include the FIFO memory 12 of the data storage apparatus according to the embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A data storage apparatus comprising:
a memory configured to store data;
an input delay circuit configured to input a set of data of a plurality of bits into the memory at different timings between the plurality of bits by adding different delays to the plurality of bits in the set of data or by adding different delays to bits in bit groups obtained by grouping the plurality of bits in units of a consecutive bits; and
an output delay circuit configured to obtain an original set of data, which is the set of data before the input delay circuit adds the different delays, by adding, to the plurality of bits in the set of data output from the memory, delays having a pattern opposite that of the delays added by the input delay circuit,
wherein a plurality of write address terminals of the memory for which write address signals for writing data into the memory are provided are connected to a plurality of write address lines that provide the write address signals for the memory such that an order in which the write address terminals for a most significant bit (MSB) to a least significant bit (LSB) are arranged is switched relative to an order in which the write address lines for the MSB to the LSB are arranged, and
wherein a plurality of read address terminals of the memory for which read address signals for reading data from the memory are provided are connected to a plurality of read address lines that provide the read address signals for the memory in the same switching pattern as a switching pattern of the order of the write address terminals relative to the write address lines.

2. The data storage apparatus according to claim 1, wherein the number of bits in the bit groups is equal to or larger than eight.

3. The data storage apparatus according to claim 1,
wherein the write address terminals for the LSB, a first bit from the LSB, a second bit from the LSB, a third bit from the LSB, and a fourth bit from the LSB are connected to the write address lines for a second bit from the LSB, a third bit from the LSB, a fourth bit from the LSB, the LSB, and a first bit from the LSB, respectively, and
wherein the read address terminals for the LSB, a first bit from the LSB, a second bit from the LSB, a third bit from the LSB, and a fourth bit from the LSB are connected to the read address lines for a second bit from the LSB, a third bit from the LSB, a fourth bit from the LSB, the LSB, and a first bit from the LSB, respectively.

4. The data storage apparatus according to claim 1,
wherein the set of data includes an error-correcting code, the data storage apparatus further comprising:
an error-correcting code generation circuit configured to generate, for data included in the set of data input to the input delay circuit other than data for the error-correcting code, an error-correcting code;
an error detection circuit configured to detect a bit error for the set of data output from the output delay circuit; and
an error correction circuit configured to correct the bit error for the set of data output from the output delay circuit, based on a result of the detection of a bit error performed by the error detection circuit.

5. A method for storing data comprising:
inputting a set of data of a plurality of bits into a memory at different timings between the plurality of bits by adding different delays to the plurality of bits in the set of data or by adding different delays to bits in groups obtained by grouping the plurality of bits in units of a plurality of consecutive bits;
outputting the set of data from the memory; and
obtaining an original set of data, which is the set of data before the different delays are added, by adding, to the plurality of bits in the set of data output from the memory, delays having a pattern opposite that of the delays added,
wherein a plurality of write address terminals of the memory for which write address signals for writing data into the memory are provided are connected to a plurality of write address lines that provide the write address signals for the memory such that an order in which the write address terminals for a most significant bit (MSB) to a least significant bit (LSB) are arranged is switched relative to an order in which the write address lines for the MSB to the LSB are arranged, and
wherein a plurality of read address terminals of the memory for which read address signals for reading data from the memory are provided are connected to a plurality of read address lines that provide the read address signals for the memory in the same switching pattern as a switching pattern of the order of the write address terminals relative to the write address lines.

6. The method for storing data according to claim 5, wherein the set of data includes an error-correcting code.

* * * * *